United States Patent
Rostoker et al.

(10) Patent No.: US 6,181,011 B1
(45) Date of Patent: Jan. 30, 2001

(54) METHOD OF CONTROLLING CRITICAL DIMENSION OF FEATURES IN INTEGRATED CIRCUITS (ICS), ICS FORMED BY THE METHOD, AND SYSTEMS UTILIZING SAME

(75) Inventors: Michael D. Rostoker, Boulder Creek; Kumaraguru Muthukumaraswamy, Santa Clara, both of CA (US)

(73) Assignee: Kawasaki Steel Corporation, Tokyo (JP)

(*) Notice: Under 35 U.S.C. 154(b), the term of this patent shall be extended for 0 days.

(21) Appl. No.: 09/221,817

(22) Filed: Dec. 29, 1998

(51) Int. Cl.[7] .................................................. H01L 23/48
(52) U.S. Cl. ........................ 257/758; 257/775; 257/784
(58) Field of Search ..................................... 257/760, 759, 257/758, 775, 784, 754

(56) References Cited

U.S. PATENT DOCUMENTS

| | | | |
|---|---|---|---|
| 4,944,836 | 7/1990 | Beyer et al. ............................ | 156/645 |
| 5,262,354 | 11/1993 | Cote et al. ............................. | 437/195 |
| 5,330,883 | 7/1994 | Garza ..................................... | 430/513 |
| 5,354,706 | 10/1994 | Patrick .................................... | 437/67 |
| 5,422,516 | * 6/1995 | Hosokawa et al. . | |
| 5,602,423 | 2/1997 | Jain ........................................ | 257/752 |
| 5,635,423 | 6/1997 | Huang et al. .......................... | 437/195 |
| 5,663,076 | 9/1997 | Rostoker et al. ...................... | 438/14 |
| 5,693,568 | 12/1997 | Liu et al. ............................... | 437/195 |
| 5,708,303 | 1/1998 | Jeng ....................................... | 257/758 |
| 5,736,457 | 4/1998 | Zhao ...................................... | 438/624 |
| 5,753,967 | 5/1998 | Lin ......................................... | 237/635 |
| 5,789,818 | * 4/1998 | Havemann . | |
| 5,801,904 | 9/1998 | Kinoshita et al. ..................... | 360/106 |
| 5,905,307 | * 5/1999 | Onoda . | |
| 5,949,143 | * 9/1999 | Bang . | |
| 5,998,814 | * 12/1999 | Yamada et al. . | |
| 6,060,176 | * 5/2000 | Semkow et al. . | |
| 6,066,896 | * 5/2000 | Wada et al. . | |

* cited by examiner

Primary Examiner—Sheila V. Clark
(74) Attorney, Agent, or Firm—Gerald E. Linden (57) ABSTRACT

An integrated circuit (IC chip) has features such as conductive lines. The features have a thickness "T", a width "W", and a distance (spacing) "S" between adjacent features, and one or more of the following aspect ratio relationships: a ratio of width:thickness (W/T) is less than or equal to 0.7:1; a ratio of width:spacing (W:S) is less than or equal to 0.7:1; and a ratio of thickness:spacing (T:S) is less than or equal to 0.1:1. These relationships are particularly applicable to ICs having a feature geometry (width) of less than 0.16 microns and operating at less than 1.8 volts. An IC incorporating such features is suitably included in a system or subsystem having electrical functionality, such as general purpose computers, telecommunications devices, and the like.

14 Claims, 8 Drawing Sheets

METHOD OF CONTROLLING CRITICAL DIMENSION OF FEATURES IN INTEGRATED CIRCUITS (ICS), ICS FORMED BY THE METHOD, AND SYSTEMS UTILIZING SAME

TECHNICAL FIELD OF THE INVENTION

The present invention relates to dimensions and ratios of dimensions of features of elements of integrated circuit (IC) chips, primarily metal lines, but also including poly-silicon or other device features.

BACKGROUND OF THE INVENTION

Modern integrated circuit (IC) chips comprise a semiconductor substrate and a large number of active devices (e.g., transistors, gates) which are formed in the substrate and which are interconnected to one another with conductive traces (lines). The traces typically are formed either of metal or of polysilicon, and resemble a ribbon having a width dimension (W) and a thickness dimension (T). A large number of such conductive traces are typically present on a given IC chip, and are spaced a distance (S) from one another.

As a general proposition, the trend is towards forming features, including conductive traces (e.g., metal lines), which are smaller and smaller, permitting an increasing number of active devices to be interconnected in increasingly complex manners on semiconductor devices, thereby enabling enhanced functionality and increased operating speeds. In other words, reducing device dimensions allows higher density logic integration and faster speeds. This has been the primary motivation of plunging into sub-micron dimensions. The scaling trend towards smaller-and-smaller dimensions leads to smaller feature size, complex device physics, increase of chip size, increase in operating frequencies and increase in chip complexity. The physical parameters affected are decrease of gate and metal width, spacing and thickness, decrease of dielectric thickness and increase of interconnect length. The scaling impact on the electrical parameters is potentially an increase of total capacitance, with increasingly dominant coupling effects, increase of interconnect resistance and the inductance effects at chip level. Interconnect effects, mainly delay, starts playing the dominant role in deciding the performance of the circuit at small geometries, such as 0.35 $\mu$m and below. By plotting wire-length distribution over feature size and die size, it is evident that signal delay is dominated by RC interconnect peaks as we go to lower feature size and higher die size.

Scaling is not done by the same factors for all the variables i.e. length, width, thickness of gate and metal layers, dielectric thickness and voltage are not scaled by the same factors. It can be shown that in some cases it is not allowed by available technology, for example, some dimensions are not practicable by current lithography, diffusion, etc. limitations and other cases it will not lead to high performance ICs.

The technology solutions available to solve this problem are:
  1) Increase in the number of layers, which will result in shorter interconnects;
  2) Using higher conductivity materials like copper, since resistance is inversely proportional to conductivity; and
  3) Using materials with low dielectric constant like polyimide.

All the above solutions leads to higher cost for production (fab) and design.

Utilizing what is now considered to be "old" technologies, feature sizes limited to on the order of >0.5 $\mu$m resulted, and resemble a wide ribbon having a width dimension (W) which is substantially in excess of the thickness dimension (T) along the length of trace for older technologies. In other words, typically W>>T, or the cross-sectional area ratio W:T is >>1.

Newer technologies, facilitating smaller geometries (on the order of 0.35 $\mu$m feature size), permit near one-to-one (1:1) ratio of width-to-thickness, or tall thin cross-sectional structures over the length of a conductive trace.

DISCUSSION OF THE PRIOR ART

Integrated circuit (IC) chips, such as those found in computers and electronic equipment, often contain up to millions of transistors and other circuit elements fabricated on a single chip. To achieve a desired functionality, a complex network of signal paths must typically be routed to interconnect the circuit elements with one another. Efficient routing of signals across a chip becomes increasingly difficult as integrated circuit complexity grows. To ease this task, interconnection wiring, which not too many years ago was limited to a single level of metal conductors (traces, lines), on today's devices may contain a plurality (e.g., five or more) stacked levels of interconnection wiring of densely-packed conductive (typically metallic) traces separated by layers of insulating (dielectric) material.

Modern interconnect (wiring) layers typically are formed by one of two general techniques. In a first technique ("deposit-pattern-etch"), a conductive film (layer) is "blanket" deposited over a preferably planar underlying insulation layer which usually contains vias, or through holes, allowing the conductive film to contact underlying circuit structures where electrical connections to those circuit structures are required. Portions of the conductive film are then selectively etched away, in any of a number of known ways typically using a mask pattern (and an etchant), leaving a network (pattern) of separate conductors, each having a similar thickness, and each having a generally rectangular cross-section extending across the underlying insulating layer. Prior to forming a subsequent wiring layer, the conductors are covered with an interlevel dielectric layer and the processes of depositing and patterning another conductive film are repeated, as required.

A second technique for forming interconnection layers is known as the "damascene" process, so-named as being reminiscent of an inlaid metal technique perfected in ancient Damascus for decorating swords and the like. The damascene technique involves etching a network (pattern) of channels (trenches) into the top surface of an insulating (dielectric) layer which preferably has been planarized, such as by chemical-mechanical polishing, and then depositing a conductive film over the etched insulating layer, thereby filling the channels with conductive material. Then, excess conductive material which is not in the channels, but rather is on the top surface of the insulating layer, is removed, such as by chemical-mechanical etching, which also helps planarize the insulating layer in preparation for applying, etching channels in and filling with conductive material a subsequent insulating layer. This process was described in the patent literature as early as 1990, and reference is made to U.S. Pat. No. 4,944,836, which is incorporated in its entirety by reference herein.

The damascene process is particularly attractive for sub-micron interconnect fabrication. Chemical etching processes are well known which can anisotropically (i.e., unidirectionally) etch insulating material such as silicon dioxide to form high-aspect ratio (i.e., deep and narrow) channels (trenches) with vertical sidewalls. Materials such as low resistivity, high copper content conductive materials which are not readily patterned by masking and etching can be employed. And the damascene, by virtue of the polishing step between the application of each layer of conductive lines, results in highly planarized interconnection layers, a feature which is desirable for making multilevel (multilayer) interconnections.

As a general proposition, the harder the conductive material, the better the damascene process works. It has been noted that when working with soft materials such as Al—Cu alloys, the polishing step can result in scratching, smearing, corrosion and dishing of the conductive material, removing conductive material in the channels to below the level of the top surface of the insulating layer. This problem was addressed in U.S. Pat. No. 5,262,354, incorporated in its entirety by reference herein, which proposed depositing the soft metal such that the channels are underfilled (filled to between a few hundred nanometers (nm) and a few hundred Angstroms (Å) of the top surface of the insulating layer), then "capping" the soft material with a harder material such as tungsten before polishing. This approach, however, requires exacting control for an anisotropic deposition of the soft metal to the required depth tolerance, particularly given normal variations in trench depth and metal deposition rate across the surface of the insulating layer (typically, across the surface of an entire semiconductor wafer being processed). The typically higher resistance of the harder capping layer also tends to result in an undesirable increase in resistance for the conductors fabricated on a given interconnect level, unless compensations in conductor height and/or width are incorporated into the design.

An issue of general concern when forming conductive lines, whether by the masking/etching technique or by the damascene process is that a typical interconnection layer often contains conductors having different widths. Conductors which will carry a small current during operation will typically be narrower than conductors carrying larger currents. This can result in uneven etching when using the masking/etching technique, and a propensity for the wider conductors to dish when using the damascene process.

U.S. Pat. No. 5,602,423 (1997), incorporated in its entirety by reference herein, discloses a damascene process wherein pillars are formed in wide trenches to avoid overetching or dishing in the large channels by acting as an etch stop for polishing of the conductive material deposited into and over the wide trench.

Although the damascene process offers the advantage of improved planarization, it is time consuming in requiring numerous processing steps. Undesirably, an interface exists between the conductive via and conductive wiring. Moreover, adequate planarized layers containing an inter-wiring spacing less than 0.35 µm cannot be obtained. In response to this, the dual damascene process was developed. The dual damascene process involves the simultaneous formation of a conductive via and conductive wiring, thereby requiring fewer manipulative steps than the single damascene process and eliminating the interface between the conductive via and the conductive wiring.

U.S. Pat. No. 5,635,423 (1997), incorporated in its entirety by reference herein, discloses a dual damascene process wherein an opening or a via is initially formed in a second insulating layer above a first insulating layer with an etch stop layer therebetween. A larger opening for a trench is then formed in the second insulting layer while simultaneously extending the via opening through the etch stop layer and first insulating layer. The trench and via are then simultaneously filled with conductive material.

Additional improvements and modifications to the damascene process for forming conductive lines are disclosed in U.S. Pat. No. 5,693,568 (1997), U.S. Pat. No. 5,708,303 (1998), U.S. Pat. No. 5,736,457 (1998), U.S. Pat. No. 5,753,967 (1998), and U.S. Pat. No. 5,801,904 (1998), all of which are incorporated in their entirety by reference herein.

Glossary

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used in the description contained herein:

A/D: Analog-to-Digital (converter).
ALU: Arithmetic Logic Unit.
ASIC: Application-Specific Integrated Circuit.
ATM: Asynchronous Transfer Mode
bit: binary digit.
BLP: Board-Level Product.
byte: eight contiguous bits.
C: a programming language.
CAM: Content-Addressable Memory.
CAS: Column Address Strobe.
CCD: Charge-coupled device.
CD: Compact Disc.
CISC: Complex Instruction Set Computer (or Chip).
CMOS: Complementary Metal-Oxide Semiconductor.
CODEC: Encoder/De-Coder. In hardware, a combination of A/D and D/A converters. In software, an algorithm pair.
Core: A functional block intended to be embedded and integrated in broader logic design.
CPU: Central Processing Unit.
D/A: Digital-to-Analog (converter).
DAT: Digital Audio Tape.
DBS: Direct Broadcast Satellite.
DMA: Direct Memory Access.
DRAM: Dynamic Random Access Memory.
DSP: Digital Signal Processing (or Processor).
ECC: Error Correction Code.
EDO: Extended Data Output.
EDRAM: Extended DRAM.
EEPROM: Also E2PROM. An electrically-erasable EPROM.
EPROM: Erasable Programmable Read-Only Memory.
Flash: Also known as Flash ROM. A form of EPROM based upon conventional UV EPROM technology but which is provided with a mechanism for electrically pre-charging selected sections of the capacitive storage array, thereby effectively "erasing" all capacitive storage cells to a known state.
FPGA: Field-Programmable Gate Array
G: or (Giga), 1,000,000,000.
Gbyte: Gigabyte(s).
GPIO: General Purpose Input/Output.
HDL: Hardware Description Language.
HDTV: High Definition Television
IC: Integrated Circuit.
I/F: Interface.
I/O: Input/Output.
IEEE: Institute of Electrical and Electronics Engineers
JPEG: Joint Photographic Experts Group
K: (or kilo), 1000.

kernel: a core functionality of an operating (or other software) system.
KHz: KiloHertz (1,000 cycles per second).
LAN: Local Area Network
M: (or mega), 1,000,000
MAC: Media Access Control.
Mask ROM: A form of ROM where the information pattern is "masked" onto memory at the time of manufacture.
MCM: Multi-Chip Module.
Mb Megabyte
memory: hardware that stores information (data).
MHz: MegaHertz (1,000,000 cycles per second).
MIPS: Million Instructions Per Second
MLT: Multi-Level Technology.
MPEG: Motion Picture Experts Group. Standard for encoding moving images. Also widely used for high quality audio compression.
MPU: Micro Processing Unit.
NVRAM: Non-volatile RAM.
PLL: Phase Locked Loop.
PROM: Programmable Read-Only Memory.
PWM: Pulse Width Modulation.
PLD: Programmable Logic Device.
RAS: Row Address Strobe.
RAM: Random-Access Memory.
RISC: Reduced Instruction Set Computer (or Chip).
ROM: Read-Only Memory.
RTOS3: Real Time Operation System
SCM: Single Chip Module
SDRAM: Synchronous DRAM.
SIE: Serial Interface Engine.
SOC: System On a chip
software: Instructions for a computer or CPU.
SRAM: Static Random Access Memory.
TCP/IP: Terminal Control Protocol/internet Protocol.
UART: Universal Asynchronous Receiver/Transmitter.
USB: Universal Serial Bus.
UV EPROM: An EPROM. Data stored therein can be erased by exposure to Ultraviolet (UV) light.
VCR: Video Cassette Recorder.
VHDL: VHSIC (Very High Speed Integrated Circuit) HDL.
WAN: Wide Area Network. Such as the telephone system or the Internet, or a satellite network.
ZISC: Zero Instruction Set Computer (or Chip).

BRIEF DESCRIPTION (SUMMARY) OF THE INVENTION

An object of the present invention is to provide an improved technique for fabricating features, such as conductive lines, on integrated circuit (IC) chips.

Another object of the invention is to provide a technique for fabricating smaller features, such as conductive lines, on integrated circuit (IC) chips.

Another object of the invention is to provide a technique for fabricating integrated circuit (IC) chips which are smaller.

Another object of the invention is to provide a technique for reducing the probability of a given integrated circuit (IC) chips formed on a semiconductor wafer having physical defects from becoming inoperative due to the physical defect.

Another object of the invention is to provide a technique for forming more integrated circuit (IC) chips on a given semiconductor wafer.

According to the invention, an integrated circuit (IC chip) has features such as conductive lines. The features have a thickness "T", a width "W", and a distance (spacing) "S" between adjacent features, and one or more of the following aspect ratio relationships: a ratio of width:thickness (W/T) is less than or equal to 0.7:1; a ratio of width:spacing (W:S) is less than or equal to 0.7:1; and a ratio of thickness:spacing (T:S) is less than or equal to 0.1:1. These relationships are particularly applicable to ICs having a feature geometry (width) of less than 0.16 microns and operating at less than 1.8 volts.

The present invention addresses itself to a number of "aspect ratios" relating to features such as conductive traces on integrated circuit (IC) chips, including the aforementioned width-to-thickness, or cross-sectional area (W:T) ratio. Another critical dimension of feature size in integrated circuits which is addressed by the present invention relates to the ratio (W:S) of the width of a conductive trace in comparison to the separation (S) of the conductive trace from the next nearest conductive trace. Another critical dimension of feature size in integrated circuits which is addressed by the present invention relates to the ratio (T:S) of the thickness of a conductive trace in comparison to the separation (S) of the conductive trace from the next nearest conductive trace. Another critical dimension of feature size in integrated circuits which is addressed by the present invention relates to the ratio (W/T:S) of cross-sectional area of a conductive trace as compared to the separation (S) of the conductive trace from the next nearest conductive trace.

Several advantages result as a consequence of the present invention being able to shrink feature size on an integrated circuit (IC) chip. A distinct advantage is that by facilitating the manufacture of IC chips (semiconductor devices) having smaller features, a given semiconductor device can be made smaller, hence facilitating increased speed and performance. Additionally, the smaller the semiconductor device is, the more copies of the semiconductor device can be fabricated on a given semiconductor wafer. Such higher densities translate into lower material cost per device. Also, since discrete physical defects may randomly exist on a given wafer—rendering semiconductor devices physically incorporating such defects inoperable—by being able to fit more, smaller semiconductor devices on a given wafer, the probability of a physical defect occurring in a given semiconductor device is reduced, thus resulting in higher yields and lower per unit cost.

An integrated circuit (IC) employing the techniques of the present invention may be included in a system or subsystem having electrical functionality. Exemplary systems and subsystems that would benefit from the techniques disclosed herein may include general purpose computers and processors; communications and telecommunications devices (e.g., phones, faxes, etc.); networks; consumer devices; audio and visual (video) receiving, recording and display devices; transportation systems (e.g., vehicles); electromechanical devices, smart cards, etc.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

Certain elements in selected ones of the drawings may be illustrated not-to-scale, for illustrative clarity.

Often, similar elements throughout the drawings may be referred to by similar references numerals. For example, the element 199 in a figure (or embodiment) may be similar in many respects to the element 299 in an other figure (or embodiment). Such a relationship, if any, between similar elements in different figures or embodiments will become apparent throughout the specification, including, if applicable, in the claims and abstract.

In some cases, similar elements may be referred to with similar numbers in a single drawing. For example, a plurality of elements 199 may be referred to as 199*a*, 199*b*, 199*c*, etc.

The cross-sectional views, if any, presented herein may be in the form of "slices", or "near-sighted" cross-sectional views, omitting certain background lines which would otherwise be visible in a true cross-sectional view, for illustrative clarity.

The structure, operation, and advantages of the present preferred embodiment of the invention will become further apparent upon consideration of the following description taken in conjunction with the accompanying drawings, wherein.

DETAILED DESCRIPTION OF THE INVENTION

Figure 1:
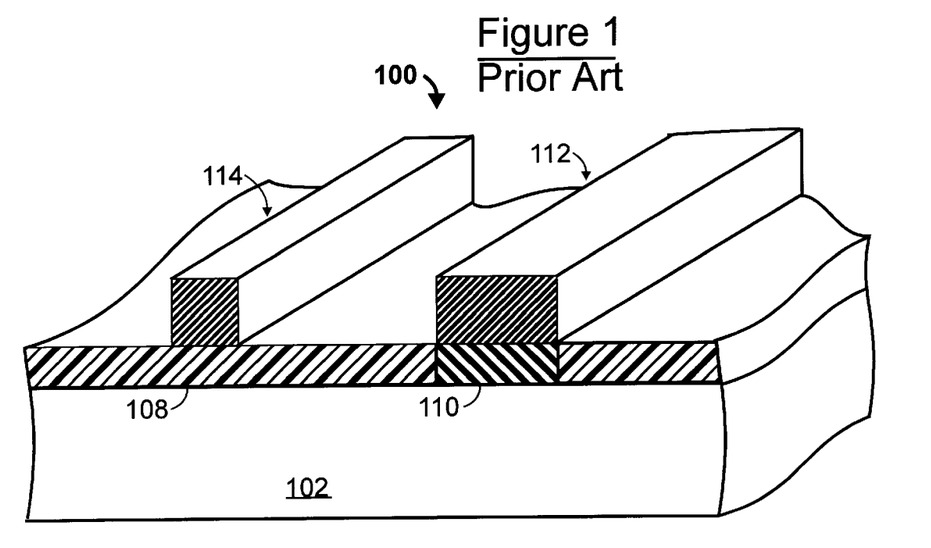
FIG. 1 is a partial perspective view of an integrated circuit (IC) chip illustrating features which are conductive lines formed on the IC chip, according to the prior art.

FIG. 1 illustrates a conventional integrated circuit (IC) chip 100 comprising a semiconductor (typically single crystal silicon) substrate 102 having a plurality of circuit elements (not shown, well known) formed therein and extending to the top (as viewed) surface thereof. Also illustrated in this figure are a plurality (two of many shown) of features which are conductive lines 112 and 114 disposed atop an insulating layer 108 which have been formed by the deposit-pattern-etch process described hereinabove. The conductive lines 112 and 114 are metallic, as indicated by the single-line cross-hatching in the figure. Also illustrated in the figure is a via through the insulting layer 108 which has been filled with a conductive material 110, typically metal as indicated by the single-line cross-hatching in the figure. In this manner, the conductive line 112 is in electrical contact with a circuit element (not shown) formed in the semiconductor substrate 102. A via filled with conductive material would extend from the conductive line 114 to another circuit element formed in the semiconductor substrate 102, but this is omitted from the figure for illustrative clarity. In this figure, and in the illustration of FIG. 2 which follows, the conductive lines are shown as straight lines, for illustrative clarity.

Figure 2:
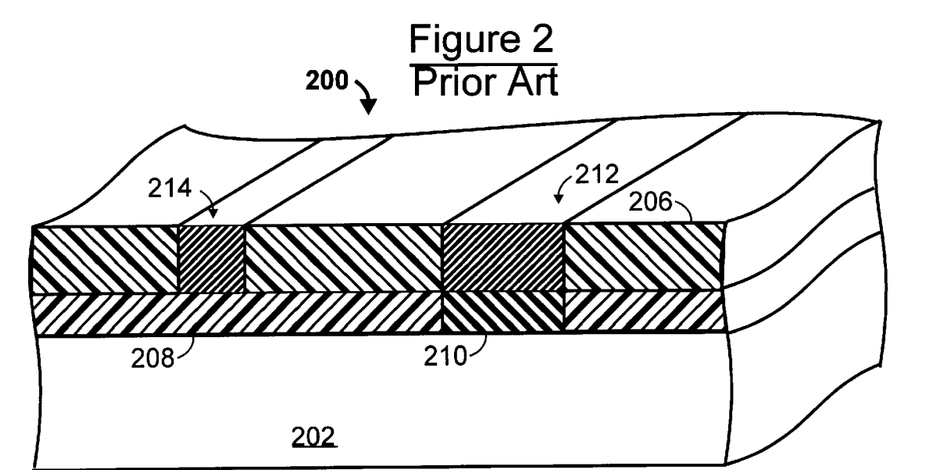
FIG. 2 is a partial perspective view of an integrated circuit (IC) chip illustrating features which are conductive lines formed on the IC chip, according to the prior art.

FIG. 2 illustrates another conventional integrated circuit (IC) chip 200 (compare 100) comprising a semiconductor (typically single crystal silicon) substrate 202 (compare 102) having a plurality of circuit elements (not shown, well known) formed therein and extending to the top (as viewed) surface thereof. Also illustrated in this figure are a plurality (two of many shown) of features which are conductive lines 212 and 214 (compare 112 and 114) embedded in an insulating layer 206 which is atop another insulating layer 208 (compare 108), which have been formed by the damascene process described hereinabove. The conductive lines 212 and 214 are metallic, as indicated by the single-line cross-hatching in the figure. Also illustrated in the figure is a via through the insulting layer 208 which has been filled with a conductive material 210 (compare 110), typically metal as indicated by the single-line cross-hatching in the figure. In this manner, the conductive line 112 is in electrical contact with a circuit element (not shown) formed in the semiconductor substrate 202. A via filled with conductive material would extend from the conductive line 214 to another circuit element formed in the semiconductor substrate 202, but this is omitted from the figure for illustrative clarity.

Figure 3:
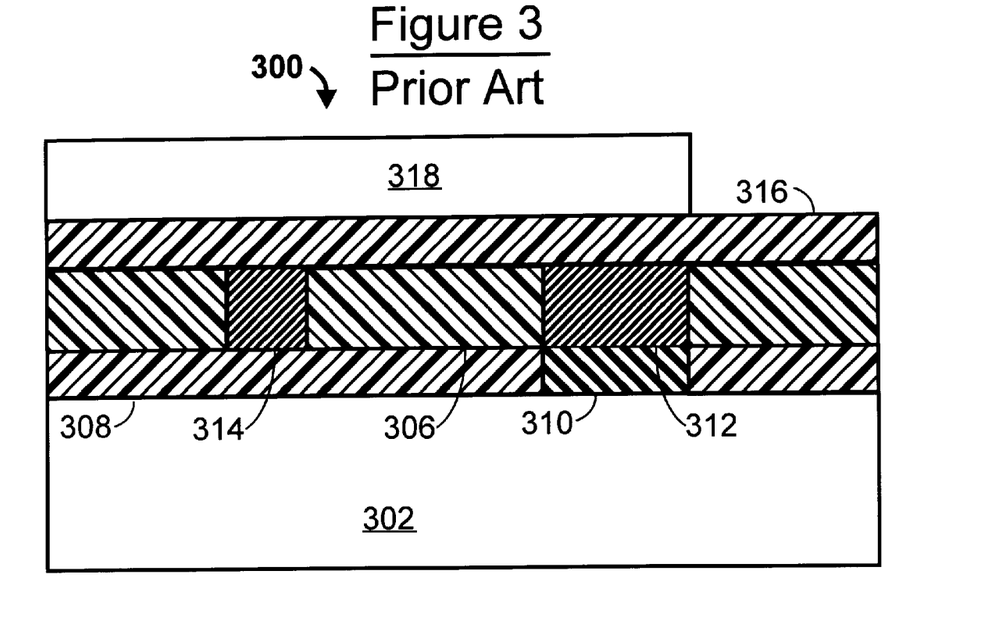
FIG. 3 is a partial cross-sectional view of an integrated circuit (IC) chip illustrating features which are conductive lines formed on the IC chip, according to the prior art.

FIG. 3 illustrates another conventional integrated circuit (IC) chip 300 (compare 100, 200) comprising a semiconductor (typically single crystal silicon) substrate 302 (compare 102, 202) having a plurality of circuit elements (not shown, well known) formed therein and extending to the top (as viewed) surface thereof. Also illustrated in this figure are a plurality (two of many shown) of features which are conductive lines 312 and 314 (compare 112/114 and 212/214) embedded in an insulating layer 306 (compare 206) which is atop another insulating layer 308 (compare 108, 208). In the case of the conductive lines 312 and 314 having been formed by the deposit-pattern-etch process (compare FIG. 1), this insulating layer 306 is likely deposited as part of an overall interlevel dielectric layer 316 applied over the conductive lines 312 and 314 in preparation for applying another level of metallization to the IC chip 302. As in the previously-described figures, the conductive lines 312 and 314 are metallic, and a via extends through the insulting layer 308 which has been filled with a conductive material 310 (compare 110, 210) so that the conductive line 312 is in electrical contact with a circuit element (not shown) formed in the semiconductor substrate 302. In this figure, another conductive line 318 is illustrate (not in cross-section) extending transverse to the conductive lines 312 and 314, atop the interlevel dielectric layer 316. Vias (not shown) extending through the dielectric layer 316 would be filled with conductive material to effect connections between conductive lines in the metallization layer represented by the conductive line 318 and conductive lines in the metallization layer represented by the conductive lines 312 and 314.

Figure 4:
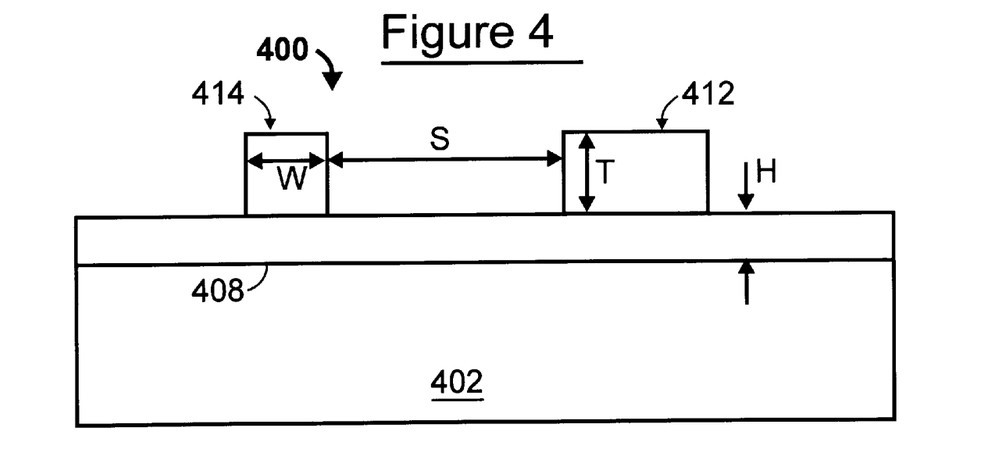
FIG. 4 is a schematic cross-sectional type illustration of an integrated circuit (IC) illustrating certain dimensional parameters associated with features which are conductive lines, as is relevant to the present invention.

FIG. 4 is a schematic cross-sectional type illustration of an IC chip 400 (compare 100, 200, 300) comprising a semiconductor substrate 402 (compare 102, 202, 302) having conductive lines 412 and 414 (compare 112/114, 212/214, 312/314) atop an insulating layer 408 (compare 108, 208, 308). The insulating layer 408 could as well be the insulating layer 316 described with respect to FIG. 3.

FIG. 4 illustrates certain dimensional parameters associated with the conductive lines 412 and 414. Herein it can be seen that each conductive line has a thickness "T" and a width "W". Also shown is that a one conductive line (e.g., 412) is spaced a distance "S" apart from a neighboring conductive line (e.g., 414). (The dimension "S" is the distance between adjacent features.) Also shown is a thickness dimension "H" of the underlying insulating layer 408.

It is a principal object of the present invention to define critical dimensions for these dimensional parameters, in terms of scaling ratios, the aim being to "fine tune" for optimal performance criteria such as speed and power, which leads to minimal interconnect delay with topologies that can be manufactured with current (or soon to be available) process technologies. There follows an analysis of capacitance effects present when two conductive lines are in proximity with one another. The resistance of conductive lines is a relatively well-known characteristic, dependent primarily on cross-sectional area, length and materials, and is not analyzed herein.

In the analysis of capacitance that follows, a contribution of resistance to the delay is not considered, for simplicity's sake. An approximate empirical formula for capacitance is:

$$C = C_{INTRINSIC} + C_{COUPLING},$$

where $$C_{INTRINSIC} = Eo^*Eox[1.15(LW/H) + 1.4(2w+2L)(T/H)^{0.222} + 4.12H(T/H)^{0.728}]$$

$$C_{COUPLING} = Eo^*Eox[0.03(W/H) + 0.83(T/H) - 0.07(T/H)^{0.222}](S/H)^{-1.3}$$

Where:
L - length of the interconnect
W - width of the interconnect
T - thickness of the interconnect
H - oxide thickness
S - spacing between two parallel conductors The coupling expression doesn't include coupling between layers.

The capacitance computed using the above expressions may have a maximum 10% error for the lateral capacitance with 0.3<W/H<10, 0.3<T/H<10, and 0.5<S/H<10, and a maximum 6% error for the overlap and fringing capacitance with 0.3<W/H<30 and 0.3<T/H<30.

As the feature size reduces from 0.35 u to 0.07 u, the interconnect shrinks in dimensions. The above expressions indicates that capacitance reduces with decrease in width of interconnect. The reduction should take into consideration current density, which may lead to electromigration, lower breakdown voltages, punch-through and oxide polarization. But current advances in CMOS technology allows us to reduce the operating voltages to lower values, from 5V to 1.8V, which alleviates the problems mentioned earlier and allows us to create interconnect with minimum dimensions.

According to the invention, features (e.g., conductive lines) having the following dimensional ratios lead to minimum capacitance effects, based on the above formulas and with above mentioned accuracy.

| Ratio | Prior Art @ >0.5 μm | Prior Art @ 0.35 μm | Invention <0.16 μm (and <1.8 volts) |
|---|---|---|---|
| W/T | 20/0.7 - 0.7/0.7 (2.9:1 - 1.0:1) | 10/0.6 - 0.5/0.6 (1.7:1 - 0.8:1) | ≦4/6 (≦0.7:1) |
| W/S | 20/2 - 0.7/0.7 (10:1 - 1.0:1) | 10/4 - 0.5/0.6 (2.5:1 - 0.8:1) | ≦1 (≦0.7:1) |
| T/S | 0.7/2 - 0.7/0.7 (0.35:1 - 1:1) | 0.6/4 - 0.6/0.6 (0.15:1 - 1:1) | ≦6/4 (≦0.1:1) |

Additional ratios can readily be determined for the dimensions "W", "T" and "S", with respect to the thickness dimension "H" of the underlying insulating (e.g., oxide) layer (e.g., 408), which is approximately 55Å (Angstroms) for 0.25 micron feature size (i.e., width "W"), 70Å for 0.35 micron feature size, and 100Å for 0.50 micron feature size.

In the preceding analysis, the effects of resistance are not considered and consideration of it may lead to greater accuracy.

Although the foregoing detailed description has primarily been directed to exemplary preferred embodiments of the present invention, it should be understood that this has been done by way of example only and not by way of limitation.

System Integration

It is clearly contemplated that the technique(s) of the present invention, as disclosed hereinabove, can be integrated with other electronic components and subsystems to realize a subsystem or a system having electrical functionality such as, but not limited to: general-purpose computers; telecommunication devices (e.g., phones, faxes, etc); networks; consumer devices; audio and visual (video) receiving, recording and display devices and systems; and vehicles such as planes, trains and automobiles.

Figure 5:
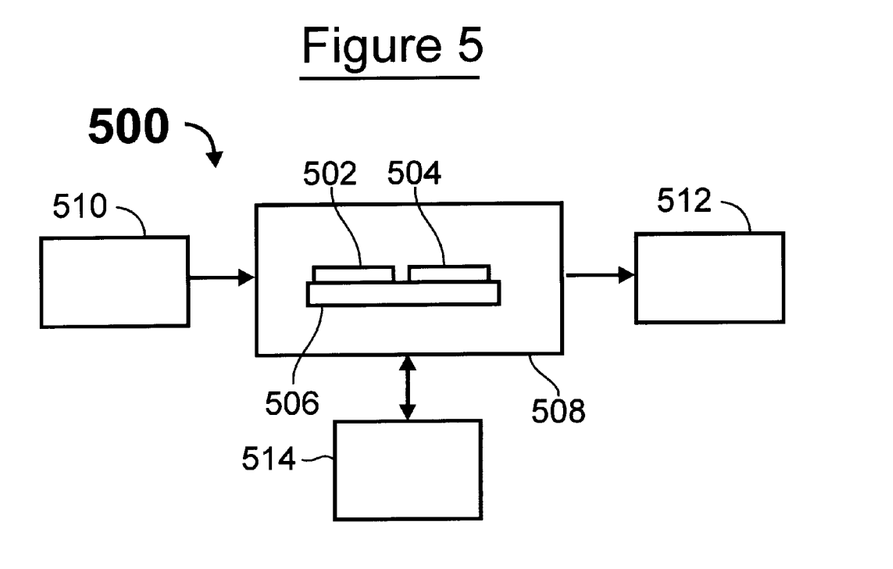
FIG. 5 is a schematic block diagram of a system incorporating the technique(s) of the present invention.

FIG. 5 illustrates an example of such an overall system 500. As shown therein, an electronic component 502 incorporating the technique(s) of the present invention can be connected, along with at least one other electronic component 504, on an interconnection substrate (e.g., motherboard) 506, thereby forming a subsystem 508, to which a number of peripheral (e.g., external) devices may be connected. Exemplary peripheral devices may include:

one or more devices 510 for providing inputs to the subsystem 508, such as keyboards, pointing devices, digitizing tablets, and the like;

one or more devices 512 for receiving outputs from the subsystem 508, such as video monitors, and the like; and one or more devices 514 for engaging in two-way communications with the subsystem 508, such as modems, printers, and the like.

It is clearly within the purview of a person having ordinary skill in the art to which the present invention most nearly pertains to effect such system integration, based on the descriptions set forth hereinabove.

Figure 5A:
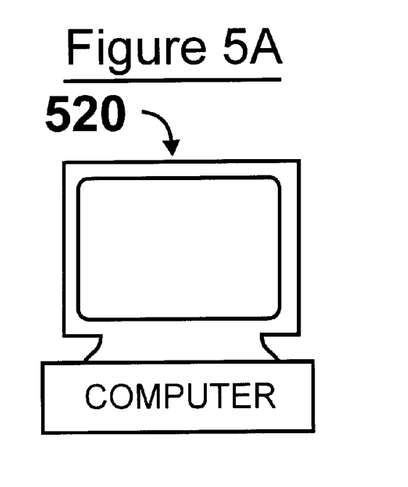
FIG. 5A is an illustration of a general purpose computer incorporating the technique(s) of the present invention.

FIG. 5A illustrates, for example, a general purpose computer 520 (compare 500) incorporating the present invention.

Figure 5B:
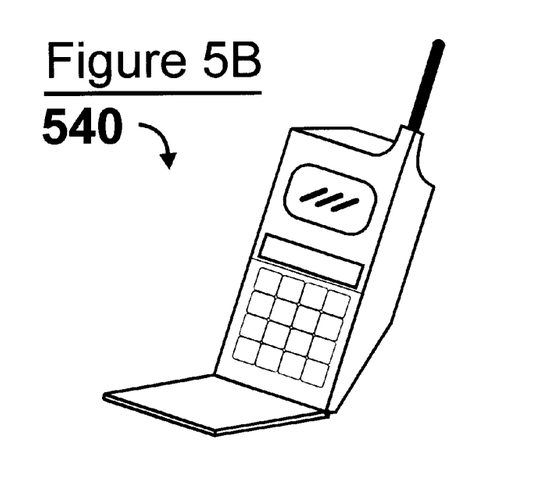
FIG. 5B is an illustration of a wireless telephone (cell phone) incorporating the technique(s) of the present invention.

FIG. 5B illustrates, for example, a wireless telephone 540 (compare 500) incorporating the present invention.

Many other combinations of features, some of which have been expressly set forth hereinabove, are within the spirit and scope of this invention and may be advantageously utilized in SCM, MCM, and BLP systems as contemplated herein.

System level products may be designed and fabricated in various forms. A system level product may, for example, include a single chip modules ("SCM") having a single semiconductor die in a single package body, with or without other electrical components, such as capacitors. System level products may also include multi-chip modules ("MCM") having two or more semiconductor dies in the same or separate package bodies, with or without other electrical components. System level products may also include board level products ("BLP"), such as those having one or more semiconductor devices on one or more printed wiring boards. Box level products ("Boxes") are also system level products which may include a combination of SCMS, MCMs, BLPs, and/or other devices. One or more of such SCMs, MCMs, BLPs or Boxes may act as, or be integrated into, a functional system or subsystem or the like.

System level products can be employed to carry out numerous applications and in various environments. For example, system level products may include:

(a) computer systems comprising personal computers, work stations, servers, embedded logic controllers, digital data storage, minicomputers, mainframe computers and super computers;

(b) information and entertainment transmission systems comprising telecommunications, satellite, cable, cellular telephones, private branch exchange, telephone switching, and video picture telephones wherein the information may be digitally compressed and forward error corrected;

(c) entertainment systems comprising digital video and audio systems, such as digital analog tape and high definition television, playback devices, display and reproduction means, for example, televisions, cameras, recorders, compact disc players/recorders, digital tape players/recorders and the like;

(d) security and surveillance systems comprising home and business security intrusion, flood and fire systems; vehicle alarms;

(e) information, data acquisition and control systems comprising industrial plant sensors and control means, and control systems utilizing information from the sensors to actuate the control means; and (f) transportation systems comprising airplanes, trains, automobiles, helicopters, rockets, missiles, boats and submarines, and the like, as well as subsystems utilized in the transportation systems, which include positioning systems (for example, global positioning systems), navigational displays and controllers, hazard avoidance systems (such as radar and sonar), fly by wire control systems and engine controlling and monitoring systems.

The above mentioned systems may also be combined to comprise larger and more complex systems that can be utilized to facilitate the infrastructure of a home, business, municipality, government entity, city wide community, state governance, world wide communications, information distribution and security.

In an SCM, a single semiconductor die is packaged and adapted for connection to external systems. This usually involves mounting the die to some sort of substrate, lead frame or carrier, connecting the bond pads on the die to some sort of conductive leads or traces and forming a package body around the die. The conductive leads or traces exit the package body, and usually terminate in external leads, pins or solder balls.

Figure 6:
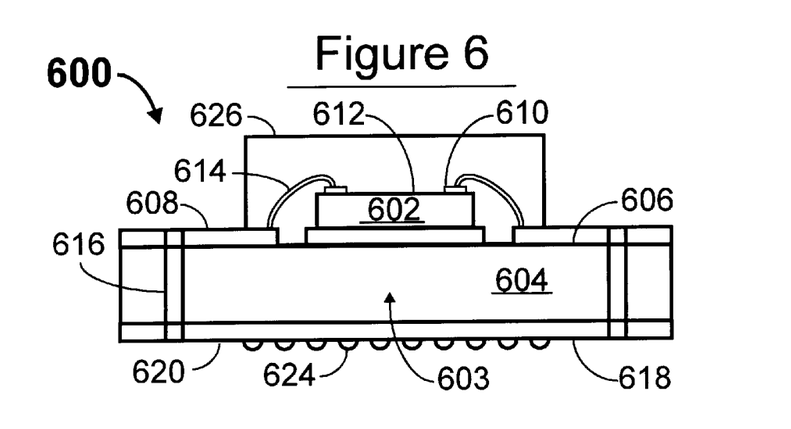
FIG. 6 is a schematic elevational view of a single chip module illustrated in cross section.

Referring to FIG. 6, a schematic elevational view of a SCM is illustrated in cross section. The SCM 600, as illustrated, is a ball bump grid array semiconductor package. A semiconductor die 602 is mounted to the top surface of a central area 603 of a substrate 604. The semiconductor die has conductive lines 612 formed thereon (not illustrated). The top surface 606 of the substrate 604 is provided with a number of conductive traces 608 that extend from near the periphery of the substrate 604 to the central area 603. The die 602 has bond pads 610 thereon. Bond wires 614 extend from the bond pads 610 to inner ends of the traces 608. Near the periphery of the substrate 604, there are plated (conductive) through-holes (vias) 616 extending from the bottom surface 618 of the substrate 604, through the substrate to a respective trace 608. The bottom surface 618 of the substrate is provided with a number of conductive traces 620, each having an end connected with a respective via 616. In this manner, signals (and power) to and from the die are connected through the bond wires 614, through the top side traces 608, through the vias 616, to the bottom side traces 620. Solder balls 624 are attached to the traces 620. A package body 626 is formed over the die 602, and partially covers the top surface of the substrate 604.

Pin grid array semiconductor packages, chip carriers (leaded or leadless), flat packs (such as plastic quad gullwing flat packs), ceramic packages and small outline integrated circuits are also examples of SCMs. Numerous other examples, designs and types of SCMs are known to those of ordinary skill in the art of semiconductor integrated circuit packages.

When two or more semiconductor dies are mounted in the same or separate package body, with or without other electrical components, the resulting assembly is typically referred to as a multi-chip module (MCM).

In order to connect to one of the two or more semiconductor dies of a MCM, a substrate having conductive traces (like substrate 604 of FIG. 6) is often used. Additional components such as capacitors, resistors and inductors may be mounted to the substrate. Often, the interconnections between the various components mounted to the substrate necessitate a large number of conductive traces which need to cross one another. In such cases, it is known to provide a substrate, having alternating layers of insulating material (such as fiberglass, teflon, FR4, BT resin, and the like) and conductive trace patterns (typically formed of metal foils, such as copper). The conductive traces from one layer are typically connected to the conductive traces of another layer by plated through-holes or vias.

Figure 7:
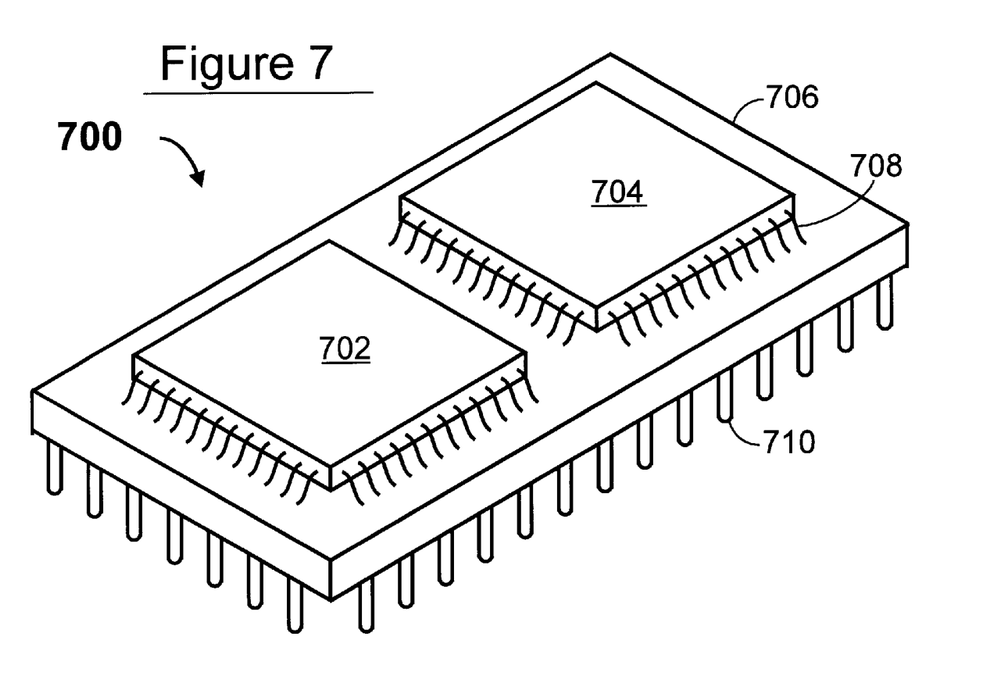
FIG. 7 is a schematic perspective view of a multi-chip module.

FIG. 7 illustrates a schematic perspective view of a MCM. MCM 700 comprises a substrate 706 having conductive lines formed thereon (not illustrated), at least two semiconductor dies 702 and 704 disposed on the substrate 706 and electrically connected to conductive lines (not illustrated) of the substrate 706 by the outer tips of lead frame leads 708. The dies 702 and 704 may be physically mounted to the substrate 706. The two semiconductor dies 702 and 704 are illustrated encapsulated, however, non-encapsulated flip-chip ball bump dies are also contemplated. One or more layers of conductive traces and plated through-holes (not illustrated) may be disposed within substrate 706 and are used to connect the semiconductor dies 702 and 704 to one another and to external connections 710, such as the solder ball bump structures as described above. Additional electrical components, such as capacitors, resistors and inductors (not illustrated) may also be disposed on and connected to the substrate 706. Numerous other examples, designs and types of MCMs are known to those of skill in the art of semiconductor packages.

A BLP typically includes one or more semiconductor devices (such as a single chip module and/or a multi-chip module), in addition to other components, on one or more printed wiring boards.

Figure 8:
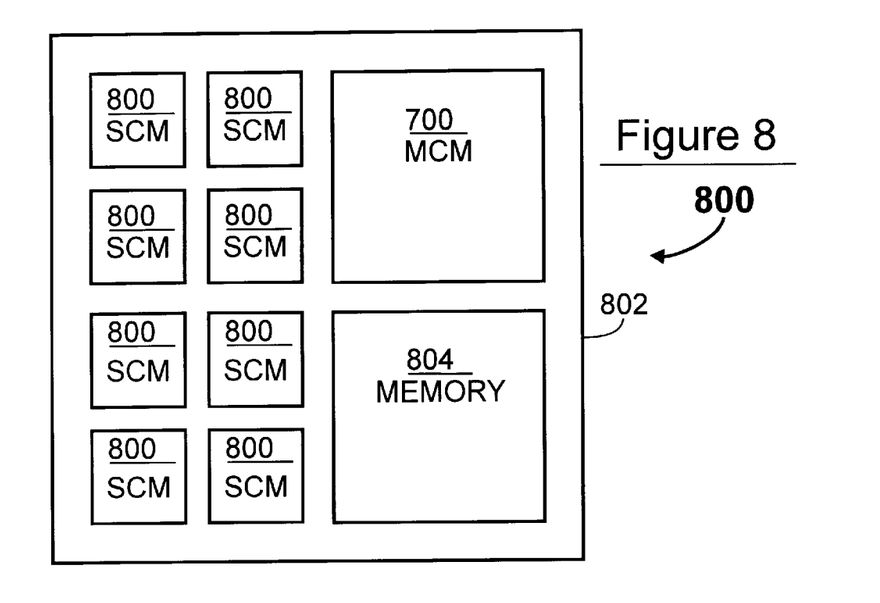
FIG. 8 is a schematic top view of a board level product.

FIG. 8 illustrates a schematic top view of a board level product (BLP). The BLP 800 comprises an array of SCMs 600, a MCM 700, and a memory component 704. The SCMs 600, the MCM 700, and memory 804 are each disposed on and connected to a printed wiring board 802. The printed wiring board 802 provides for all connections between those components. Examples of BLPs include central processing unit boards, memory boards, and interface boards (as are routinely utilized in computer systems).

Boxes are also system level products which may include a combination of SCMS, MCMs, BLPS, and/or other devices. For example, multiple board level products may be connected in parallel with one another by a bus (such as a back plane bus, which is also referred to as a mother board), which communicates signals therebetween. Numerous other examples, designs and types of Boxes are readily apparent to one of ordinary skill in the art. The conductive leads wires exit the boxes, and are usually terminated at external leads or pins.

Figure 9:
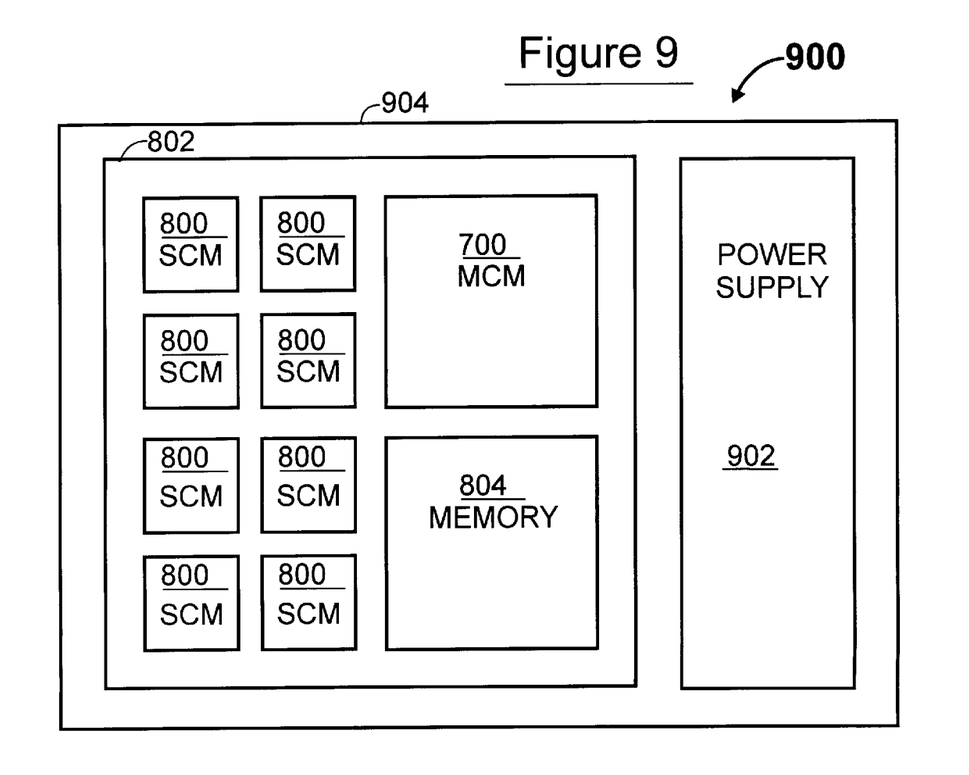
FIG. 9 is a schematic top view of a box level product.

FIG. 9 illustrates a schematic top view of a box level product. The box level product 900 comprises at least one printed wiring board 802 as described above, a power supply 902 and an enclosure or box 904 containing the at least one board 802 and the power supply 902. One or more box level products may be used to create more complex systems according to the present invention.

Figure 10:
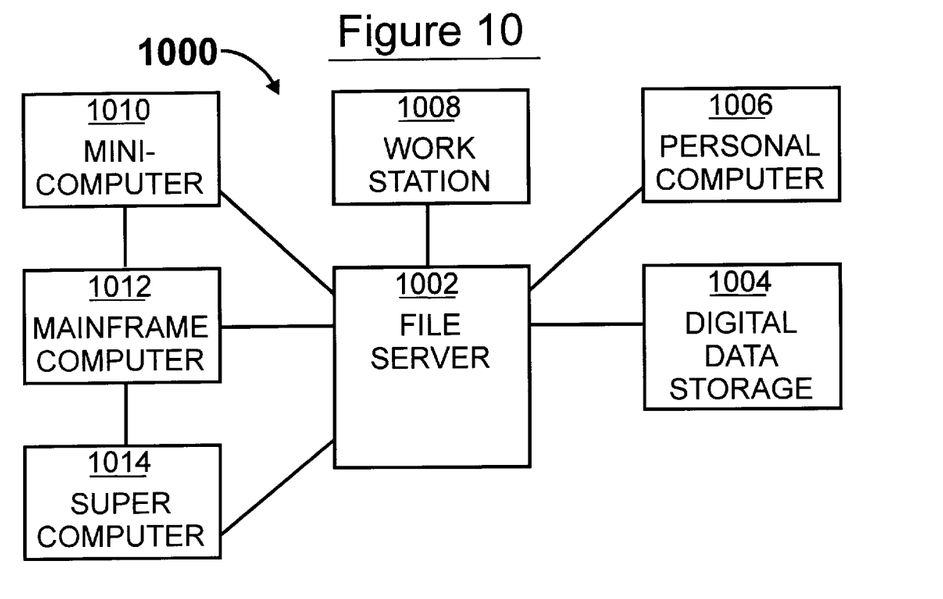
FIG. 10 a schematic block diagram of a computer system.

FIG. 10 illustrates a schematic block diagram 1000 of various computer systems interconnected together via various digital data transmission systems. A file server 1002 is connected to a digital data storage device 1004 such as, for example, magnetic hard disk, tape, optical disk, flash memory, core memory, semiconductor memory and the like. The server 1002 may be connected to at least one personal computer 1006, a work station 1008, a minicomputer 1010, a mainframe computer 1012, and a super computer 1014 through a number of digital data transmission system networks such as token ring, star, coaxial, fiber-optic and the like. These networks may utilize data protocols such as Scaleable Coherent Interface ("SCI"), ANSI/IEEE Std 1596–1992SCI, Asynchronous Transfer Mode ("ATM"), FiberChannel, SerialBus, SCSI, SSA, QuickRing, HIPPI, FDDI, Ethernet and the like.

Figure 11:
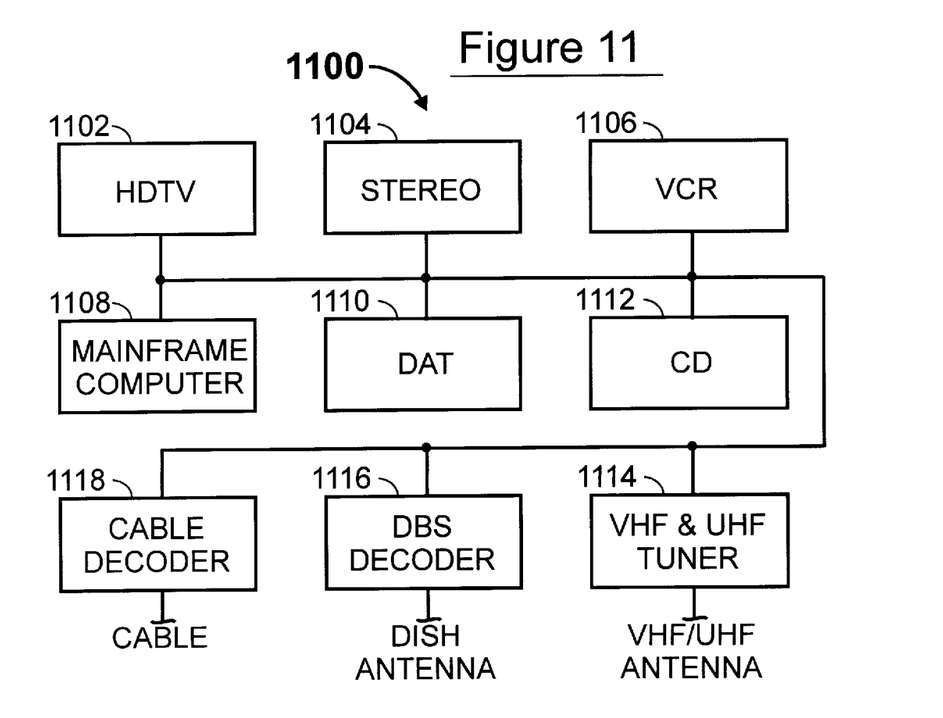
FIG. 11 a schematic block diagram of an entertainment system.

FIG. 11 is a schematic block diagram of an entertainment system according to the present invention. The entertainment system 1100 may be comprised of the following component subsystems: a high definition television (HDTV) 1102, a stereo 1104, a video cassette recorder (VCR) 1106, a television camera/recorder (Camcorder) 1108, a digital audio tape unit (DAT) 1110, a compact disk player (CD) 1112, a VHF/UHF tuner 1114, a direct broadcast satellite (DBS) decoder 1116, and a cable decoder 1118. These component subsystems are made up of SCM, MCM, BLP and boxes as disclosed above.

Figure 12:
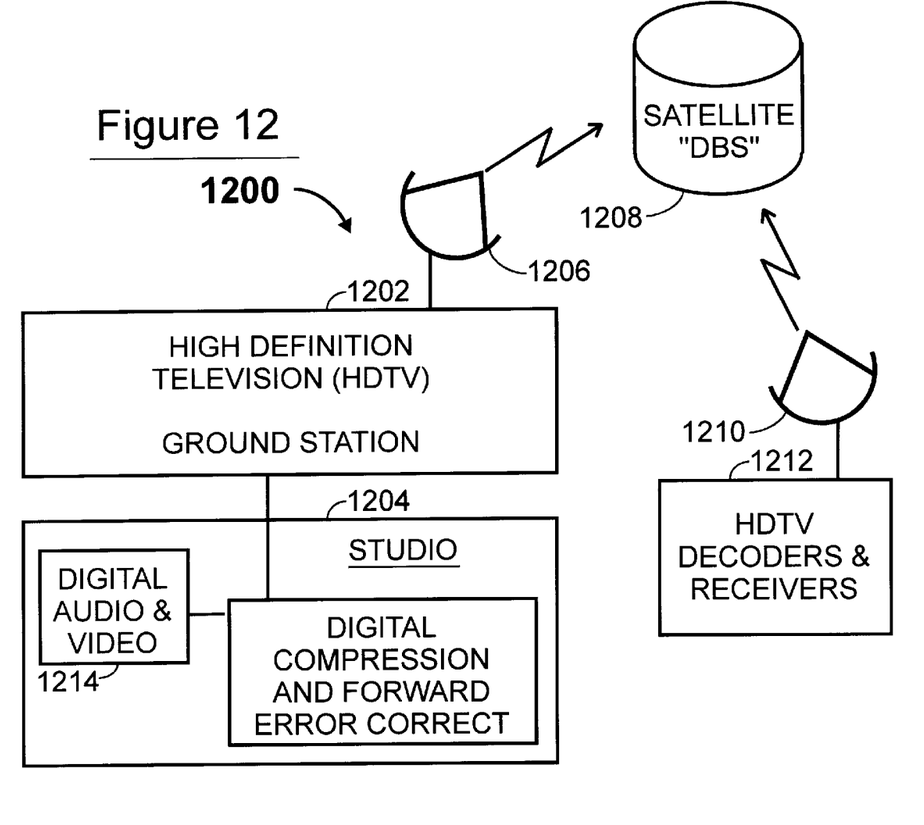
FIG. 12 is a schematic block diagram of an information and entertainment transmission system.

The DBS decoder 1116 receives a digitally encoded and forward error corrected signal from a dish antenna (not illustrated) which receives a DBS entertainment signal from a geosynchronous satellite (see FIG. 12). Hardwired cable is connected to the cable decoder 1118 which decodes and converts the cable entertainment channels to signals for viewing on the HDTV 1102 or a standard television (not illustrated). Standard broadcast television and stereo signals may be received by the VHF/UHF tuner 1114 and the base band signals made available to the HDTV 1102, stereo 1104 and the other recording devices (VCR 1106, DAT 1110). Similarly, recorded entertainment information may be played on the HDTV 1102 and stereo 1104 from the playback devices OAT 1110, Camcorder 1108, CD 1112, VCR 1106) for viewing and listening enjoyment by the user.

FIG. 12 is a schematic block diagram of an information and entertainment communications system according to the present invention. The information and entertainment communications system 1200 is comprised of the following systems: A HDTV ground station 1202 which transmits a digitally encoded and forward error corrected signal from the HDTV studio 1204 by microwave dish 1206 to a DBS satellite 1208. The satellite 1208 rebroadcasts the signal from the studio 1204 to a plurality of ground station dish antennas 1210 which are connected to corresponding HDTV receivers/decoders 1212 where the DBS satellite signal is processed and made available, for example, to the entertainment system 1100. The system 1200 is comprised of many SCM, MCM, BLP and box level subsystems which greatly benefit from the features, aspects and advantages of the present invention. Some of these subsystems are a digital audio and video formatting subsystem 1214 which convert the analog entertainment information into a digital format, and a digital compression and forward error connection subsystem 1216 which prepares the digitally encoded entertainment information for transmission by the ground station 1202 to the satellite 1208.

Figure 13:
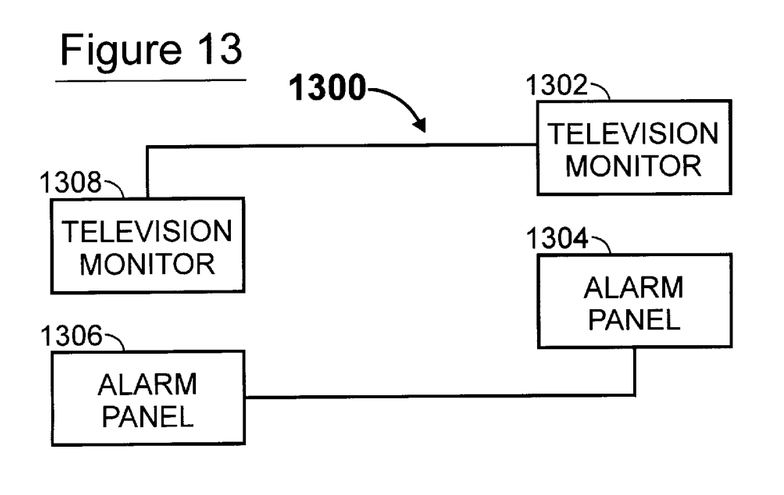
FIG. 13 is a schematic block diagram of a security and surveillance system.

FIG. 13 is a schematic block diagram of a security and surveillance system according to the present invention. The security and surveillance system 1300 is comprised of the following subsystems: A television camera 1302, intrusion detection sensors 1304, a sensor alarm panel 1306, and a television monitor 1308. The television monitor 1308 displays what the television camera(s) 1302 observe. The alarm panel 1306 displays the status of the sensors 1304 and will annunciate an alert upon a sensed alarm condition. The system 1300 may be utilized in homes, businesses, government building, military bases, prisons and any area requiring security and surveillance.

Figure 15:
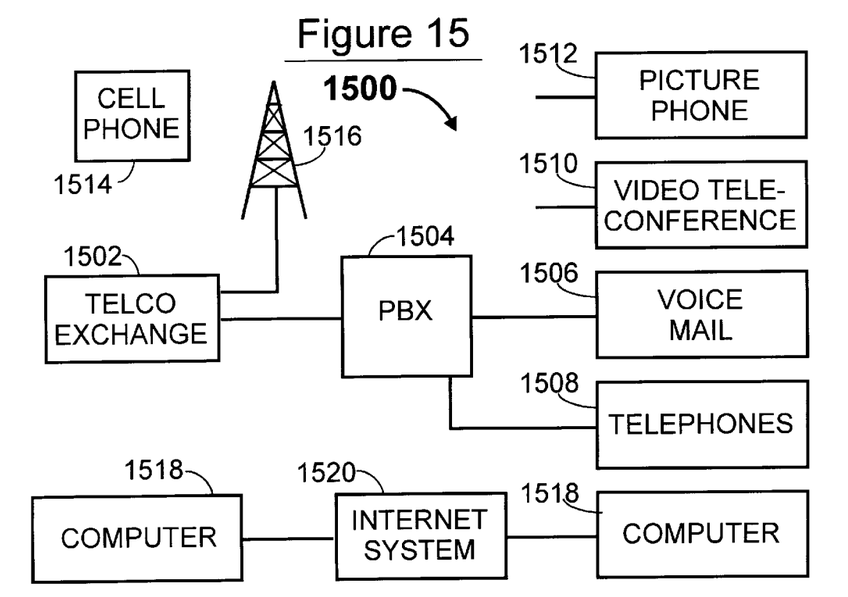
FIG. 15 is a schematic block diagram of a plurality of communications and information transmission systems.

In addition, another embodiment of the security and surveillance system 1300 may be utilized to monitor operating conditions of transportation systems such as engine status, hull integrity, operating temperatures, maintenance evaluation and other parameters deemed necessary for the safe and efficient operation of the transportation systems (see FIG. 15). In a further embodiment of subsystems for the transportation systems, positioning and navigational (GPS) systems may be utilized for hazard avoidance, as well as radar and sonar (see FIG. 15).

Further, operation of the transportation systems may be implemented by digital control, such as "fly-by-wire", along with the monitoring thereof. The system 1300 and its subsystems may be utilized with the other system embodiments disclosed herein and will greatly benefit from the features, aspects and advantages of invention as disclosed hereinabove.

Figure 14:
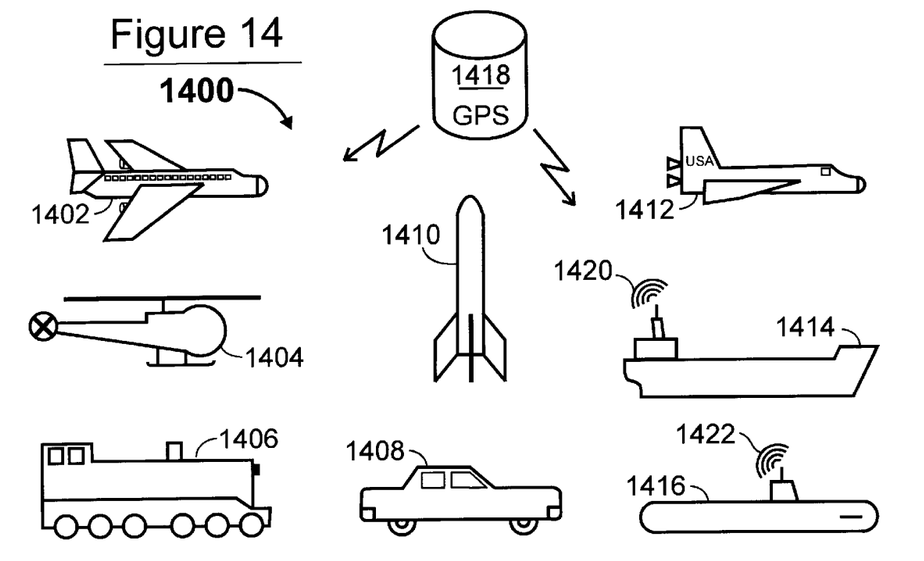
FIG. 14 is a schematic block diagram of a plurality of transportation systems.

FIG. 14 is a schematic block diagram of a plurality of transportation systems according to the present invention. The transportation systems, generally referenced to by the numeral 1400, may utilize, individually or in combination, the aforementioned systems to great advantage. Embodiments of the transportation system 1400 is as follows: An airplane 1402, a helicopter 1404, a train 1406, a vehicle 1408 such as an automobile or truck, a rocket 1410, a space shuttle 1412, a ship 1414, a submarine 1416, and the like. Each of the embodiments of the transportation systems 1400 contemplated herein may greatly benefit from the communications, navigation and control systems disclosed herein along with he features, aspects and advantages of the present invention.

Each of the embodiments of the transportation systems 1400 may utilize a positioning and navigation system which derives its position information from a global positioning satellite system (GPS) 1418. The positioning and navigation system is comprised of SCM, MCM, BLP and box level systems as discussed hereinabove. Radar 1420 and/or sonar 1422 systems may be utilized for collusion avoidance and location and may be incorporated with any of the transportation systems 1400.

FIG. 15 is a schematic block diagram of a plurality of communications and information transmission systems according to the present invention. The communications and information transmission systems 1500 may comprise, individually or in combination, a telephone exchange 1502, a PBX 1504, a voice mail system 1506, telephones 1508, a video teleconferencing system 1510, a video picture telephone 1512 and the like. The systems 1500 may also comprise a cellular telephone 1514, and a plurality of cell sites 1516 which may be connected with the telephone system 1502. Further, systems 1500 may be computers 1518 connected together through the internet system 1520. Both analog and digital communications are contemplated herein with the various features, advantages and aspects of the present invention.

Other MCM, SCM, mini-board, micro-board, board level and other system sub-assemblies are contemplated using the multi-layer substrate of the present invention. Additionally, such sub-assemblies or packages using such multi-layer substrate circuits may be used in traditional circuit boards or sub-assemblies for a system level product. Examples of electronic systems that may benefit from the system and method of the present invention have been mentioned above. The spirit and intent of the present invention is to utilize multi-layer conductive planes on a substrate for all electronic systems from a single semiconductor integrated circuit die to a complex multiple box electronic system.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art and which are encompassed within the spirit of the invention and the scope of the appended claims.

While the present invention has been depicted, described, and is defined by reference to particularly preferred embodiments of the invention, such references do not imply a limitation on the invention, and no such limitation is to be inferred. The invention is capable of considerable modification, alternation, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

The present invention, therefore, is well adapted to carry out the objects and attain the ends and advantages mentioned, as well as others inherent therein.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. An integrated circuit (IC) chip having conductive lines, the conductive lines having a thickness "T", a width "W", and a distance (spacing) "S" between adjacent conductive lines, characterized in that:

a ratio of width:thickness (W/T) is less than or equal to 0.7:1.

2. An IC chip, according to claim 1, wherein:

the conductive lines are metal lines.

3. An IC chip, according to claim 1, wherein:

the conductive lines comprise poly-silicon.

4. An IC chip, according to claim 1, wherein:

the conductive lines have a width of less than 0.16 microns; and the IC chip is operated at less than 1.8 volts.

5. An integrated circuit (IC) chip having conductive lines, the conductive lines having a thickness "T", a width "W", and a distance (spacing) "S" between adjacent conductive lines, characterized in that:

a ratio of width:spacing (W:S) is less than or equal to 0.7:1.

6. An IC chip, according to claim 5, wherein:

the conductive lines are metal lines.

7. An IC chip, according to claim 5, wherein:

the conductive lines comprise poly-silicon.

8. An IC chip, according to claim 5, wherein:

the conductive lines have a width of less than 0.16 microns; and the IC chip is operated at less than 1.8 volts.

9. An integrated circuit (IC) chip having conductive lines, the conductive lines having a thickness "T", a width "W", and a distance (spacing) "S" between adjacent conductive lines, characterized in that:

a ratio of thickness:spacing (T:S) is less than or equal to 0.1:1.

10. An IC chip, according to claim 9, wherein:

the conductive lines are metal lines.

11. An IC chip, according to claim 9, wherein:

the conductive lines comprise poly-silicon.

12. An IC chip, according to claim 9, wherein:

the conductive lines have a width of less than 0.16 microns; and the IC chip is operated at less than 1.8 volts.

13. An electronic system incorporating at least one integrated circuit (IC chip), said IC chip comprising conductive lines, the conductive lines having a thickness "T", a width "W", and a distance (spacing) "S" between adjacent conductive lines, characterized in that the conductive lines have an aspect ratio relationship selected from the group comprising:

a ratio of width:thickness (W/T) is less than or equal to 0.7:1;

a ratio of width:spacing (W:S) is less than or equal to 0.7:1; and a ratio of thickness:spacing (T:S) is less than or equal to 0.1:1.

14. An electronic system, according to claim 13, wherein the electronic system is selected from the group consisting of general-purpose computer, telecommunication device, network device, consumer device, audio device, video device, receiver, recorder, display device, transportation system, electromechanical device, and smart card.

* * * * *